(12) United States Patent
Gong et al.

(10) Patent No.: US 12,369,451 B2
(45) Date of Patent: Jul. 22, 2025

(54) ELECTROLUMINESCENT DIODE AND DISPLAY DEVICE

(71) Applicant: GUANGDONG JUHUA PRINTED DISPLAY TECHNOLOGY CO., LTD., Guangzhou (CN)

(72) Inventors: Haotian Gong, Guangzhou (CN); Jingsheng Huang, Guangzhou (CN); Jinyong Zhuang, Guangzhou (CN)

(73) Assignee: GUANGDONG JUHUA PRINTED DISPLAY TE OGY CO., LTD., Guangzhou (CN)

( * ) Notice: Subject to any disclaimer, the term of this patent is extended or adjusted under 35 U.S.C. 154(b) by 587 days.

(21) Appl. No.: 17/781,125

(22) PCT Filed: Apr. 14, 2021

(86) PCT No.: PCT/CN2021/087101
§ 371 (c)(1),
(2) Date: May 31, 2022

(87) PCT Pub. No.: WO2021/244149
PCT Pub. Date: Dec. 9, 2021

(65) Prior Publication Data
US 2022/0416191 A1 Dec. 29, 2022

(30) Foreign Application Priority Data
Jun. 1, 2020 (CN) .......................... 202010484446.1

(51) Int. Cl.
*H01L 51/50* (2006.01)
*H10K 50/115* (2023.01)
(Continued)

(52) U.S. Cl.
CPC ........... *H10K 50/17* (2023.02); *H10K 50/115* (2023.02); *H10K 50/156* (2023.02); *H10K 50/16* (2023.02);
(Continued)

(58) Field of Classification Search
CPC ...... H10K 50/11; H10K 50/115; H10K 50/16; H10K 50/165; H10K 50/171; H10K 50/15
See application file for complete search history.

(56) References Cited

U.S. PATENT DOCUMENTS

| | | | |
|---|---|---|---|
| 7,955,718 B2 * | 6/2011 | Kambe | .......... H10K 50/14 428/917 |
| 2006/0125382 A1 * | 6/2006 | Kim | .......... H10K 50/11 313/506 |

(Continued)

FOREIGN PATENT DOCUMENTS

| | | |
|---|---|---|
| CN | 101901876 A | 12/2010 |
| CN | 102394275 A | 3/2012 |

(Continued)

OTHER PUBLICATIONS

International Search Report and Written Opinion from International Application No. PCT/CN2021/087101 mailed Jun. 29, 2021.

(Continued)

*Primary Examiner* — Jaehwan Oh
(74) *Attorney, Agent, or Firm* — Dorsey & Whitney LLP (57) ABSTRACT

The present disclosure discloses an electroluminescent diode and a display device. The electroluminescent diode includes a cathode, a luminescent layer, a hole transport layer and an anode. The hole transport layer has a hole injection control structure, the hole injection control structure includes a first hole conduction layer and a second hole conduction layer that are stacked, and a material of the (Continued)

10 second hole conduction layer is a material used in the first hole conduction layer that is P-type doped. The hole injection control structure may significantly improve the performance of hole injection in the electroluminescent diode, so as to balance a number of carriers in the electroluminescent diode, thereby effectively improving the luminescence performance and prolonging the service life thereof.

19 Claims, 4 Drawing Sheets

(51) Int. Cl.
*H10K 50/15* (2023.01)
*H10K 50/16* (2023.01)
*H10K 50/17* (2023.01)
*H10K 50/82* (2023.01)
*H10K 77/10* (2023.01)
*H10K 50/826* (2023.01)
*H10K 102/00* (2023.01)

(52) U.S. Cl.
CPC .......... *H10K 50/82* (2023.02); *H10K 77/111* (2023.02); *H10K 50/826* (2023.02); *H10K 2102/00* (2023.02); *H10K 2102/3026* (2023.02); *H10K 2102/311* (2023.02); *H10K 2102/321* (2023.02)

(56) References Cited

U.S. PATENT DOCUMENTS

| | | | |
|---|---|---|---|
| 2009/0058262 A1 | 3/2009 | Lu et al. | |
| 2009/0091246 A1* | 4/2009 | Tsuji | H10K 50/11 313/504 |
| 2018/0240994 A1* | 8/2018 | Pentlehner | H10K 50/19 |
| 2020/0287152 A1* | 9/2020 | Kim | H10K 50/82 |
| 2020/0395561 A1* | 12/2020 | Park | H10K 85/381 |
| 2021/0091327 A1* | 3/2021 | Kim | C09K 11/02 |
| 2021/0135139 A1* | 5/2021 | Lee | H10K 50/13 |
| 2021/0226172 A1* | 7/2021 | Chung | C09K 11/06 |
| 2021/0373067 A1* | 12/2021 | Xi | H10K 50/19 |

FOREIGN PATENT DOCUMENTS

| | | |
|---|---|---|
| CN | 104882546 A | 9/2015 |
| CN | 106935719 A | 7/2017 |
| CN | 107342367 A | 11/2017 |
| CN | 109004092 A | 12/2018 |
| CN | 109574989 A | 4/2019 |
| CN | 110970567 A | 4/2020 |

OTHER PUBLICATIONS

Office Action for Chinese Application No. 202010484446.1 mailed Dec. 3, 2021.

* cited by examiner

ELECTROLUMINESCENT DIODE AND DISPLAY DEVICE

CROSS-REFERENCES TO RELATED APPLICATIONS

This application is a U.S. national stage of PCT Patent Application No. PCT/CN2021/087101, entitled "ELECTROLUMINESCENT DIODE AND DISPLAY DEVICE", filed on Apr. 14, 2021; which claims priority to Chinese Patent Application No. 202010484446.1, entitled "ELECTROLUMINESCENT DIODE AND DISPLAY DEVICE" and filed with the Chinese Patent Office on Jun. 1, 2020, the entire contents of each of which are incorporated herein by reference.

TECHNICAL FIELD

The present disclosure relates to the field of electronic display technologies, and in particular, to an electroluminescent diode and a display device.

BACKGROUND

An electroluminescent diode may directly convert electric energy into light energy and has been widely used in human daily production and life. A quantum dot light-emitting diode (QLED) is a new electroluminescent diode emerging gradually, which uses a quantum dot as a luminescent layer. A luminescence wavelength of a quantum dot may be adjusted by controlling a particle size of the quantum dot. In addition, the quantum dot also has advantages of a narrow luminescent spectral line width, high color purity, high electron mobility, good optical stability and being available for flexible display. Therefore, the QLED using a quantum dot as a luminescent layer is widely used in the field of light-emitting display.

In conventional QLEDs, an imbalance generally exists between hole injection and electron injection. This is because electron injection capability of the electron transport layer to the quantum dot luminescent layer is stronger than hole injection capability of the hole transport layer to the quantum dot luminescent layer. Carrier imbalance may generally lead to charge of quantum dots, auger recombination and other non-radioluminescence problems, and may also affect the luminous efficiency and service life of devices. However, if the electron injection capability of the QLDS is reduced to balance carrier injection, the service life of the diode may be shortened.

SUMMARY

Various exemplary embodiments of the present disclosure provide an electroluminescent diode capable of balancing and increasing carrier injection to significantly improve the luminescent performance and prolong the service life of the electroluminescent diode.

According to one embodiment of the present disclosure, the electroluminescent diode includes a substrate and a functional body arranged on the substrate;
the functional body including:
a cathode and an anode arranged opposite to each other;
a luminescent layer, the luminescent layer being arranged between the cathode and the anode;
a hole transport layer, the hole transport layer being arranged between the luminescent layer and the anode, the hole transport layer having a hole injection control structure, the hole injection control structure including a first hole conduction layer and a second hole conduction layer that are stacked, a material of the second hole conduction layer being a material of the first hole conduction layer that is P-type doped.

In one embodiment, in the hole injection control structure, the first hole conduction layer is arranged on one side close to the luminescent layer, and the second hole conduction layer is arranged on one side close to the anode.

In one embodiment, an amount of the material for P-type doping in the second hole conduction layer accounts for 3% to 40% of a total amount thereof.

In one embodiment, the material of the first hole conduction layer is selected from at least one of CDBP, PVK, TCTA, CBP, NPB, NPD and HGG002.

In one embodiment, the material for P-type doping in the second hole conduction layer is selected from at least one of HAT-CN, $MoO_3$, $WO_3$ and NDP-9.

In one embodiment, the material of the first hole conduction layer is selected from CBP, and the material of the second hole conduction layer is $WO_3$-doped CBP.

In one embodiment, the material of the first hole conduction layer is selected from HGG002, and the material of the second hole conduction layer is NDP-9-doped HGG002.

In one embodiment, the electroluminescent diode is of an inverted top-emitting structure.

In one embodiment, the cathode has an electron injection control structure, the electron injection control structure includes a first electron conduction layer and a second electron conduction layer that are stacked, a material of the first electron conduction layer is a single metal, and a material of the second electron conduction layer is an alloy containing the metal used in the first electron conduction layer.

In one embodiment, the first electron conduction layer is arranged on one side close to the luminescent layer, and the second electron conduction layer is arranged on one side of the first electron conduction layer away from the luminescent layer.

In one embodiment, the material of the first electron conduction layer is selected from aluminum, silver, magnesium, ytterbium or barium.

In one embodiment, in the alloy material of the second electron conduction layer, an amount of the metal used in the first electron conduction layer accounts for 70% to 90% of a total amount thereof.

In one embodiment, in the cathode, the material of the first electron conduction layer is silver, and the material of the second electron conduction layer is a magnesium-silver alloy or an ytterbium-silver alloy.

In one embodiment, the electroluminescent diode further includes an electron transport layer arranged between the cathode and the luminescent layer, and a material of the electron transport layer is selected from at least one of zinc oxide, titanium dioxide, stannic oxide, magnesium-doped zinc oxide and aluminum-doped zinc oxide.

In one embodiment, the electroluminescent diode further includes a hole injection layer arranged between the anode and the hole transport layer.

In one embodiment, a material of the hole injection layer is selected from at least one of HAT-CN, $MoO_3$, $WO_3$, $V_2O_5$ and $Ta_2O_5$.

In one embodiment, the luminescent layer is a quantum dot luminescent layer, and a material of the quantum dot luminescent layer is a core-shell structure quantum dot.

In one embodiment, a material of the quantum dot luminescent layer is selected from a quantum dot of an II-VI group compound semiconductor, a quantum dot of an III-V group compound semiconductor, a quantum dot of an I-III-VI group compound semiconductor or a perovskite quantum dot.

In one embodiment, a material of the substrate is selected from hard glass, sapphire or flexible plastic filled with a thermal conductive filler.

In one embodiment, the electroluminescent diode further includes a hole injection layer arranged between the hole transport layer and the anode, and a material of the hole injection layer is selected from at least one of HAT-CN, $MoO_3$, $WO_3$, $V_2O_5$ and $Ta_2O_5$.

In one embodiment, a material of the anode is selected from silver, a magnesium-silver alloy, gold, indium zinc oxide or indium tin oxide.

In another aspect, according to another embodiment of the present disclosure, an electroluminescent diode capable of enhancing electron injection is further provided. The electroluminescent diode includes a substrate and a functional body arranged on the substrate;
the functional body including:
a cathode and an anode arranged opposite to each other;
a luminescent layer, the luminescent layer being arranged between the cathode and the anode;
wherein the cathode has an electron injection control structure, the electron injection control structure includes a third electron conduction layer and a fourth electron conduction layer that are stacked, a material of the third electron conduction layer is a single metal, and a material of the fourth electron conduction layer is an alloy containing the metal used in the third electron conduction layer.

In one embodiment, the third electron conduction layer is arranged on one side close to the luminescent layer, and the fourth electron conduction layer is arranged on one side of the third electron conduction layer away from the luminescent layer.

In one embodiment, the material of the third electron conduction layer is selected from aluminum, silver, magnesium, ytterbium or barium.

In one embodiment, in the alloy material of the fourth electron conduction layer, an amount of the metal used in the third electron conduction layer accounts for 70% to 90% of a total amount thereof.

In one embodiment, the material of the third electron conduction layer is silver, and the material of the fourth electron conduction layer is a magnesium-silver alloy.

In another aspect, a display device is provided, including a driving element and an electroluminescent diode; the driving element being configured to control luminescence of the electroluminescent diode, and the electroluminescent diode being the electroluminescent diode according to any one of the above embodiments.

With respect to the problems of carrier imbalance in conventional electroluminescent diodes and reduction of the service life of the device further caused, the electroluminescent diode has a carrier injection control structure. The carrier injection control structure is a hole injection control structure or an electron injection control structure. Experimental results show that the performance of hole injection of the electroluminescent diode with the hole injection control structure is significantly improved, and the luminescence performance and service life of the electroluminescent diode are effectively improved. The electron injection control structure similar to the hole control structure can improve the performance of electron injection of the electroluminescent diode to some extent, helping to prolong the service life of the electroluminescent diode.

DETAILED DESCRIPTION OF THE EMBODIMENTS

For easy understanding of the present disclosure, a more comprehensive description of the present disclosure is given below with reference to the accompanying drawings. Preferred embodiments of the present disclosure are given in the accompanying drawings. However, the present disclosure may be implemented in many different forms and is not limited to the embodiments described herein. On the contrary, these embodiments are provided to understand the disclosed content of the present disclosure more thoroughly and comprehensively.

Unless otherwise defined, all technical and scientific terms used herein have the same meaning as commonly understood by those of ordinary skill in the art to which the present disclosure belongs. The terms used in the specification of the present disclosure are intended only to describe particular embodiments and are not intended to limit the present disclosure. The term "and/or" used herein includes any and all combinations of one or more of the associated listed items. "A plurality of" used herein refers to a combination of two or more items.

Figure 1:
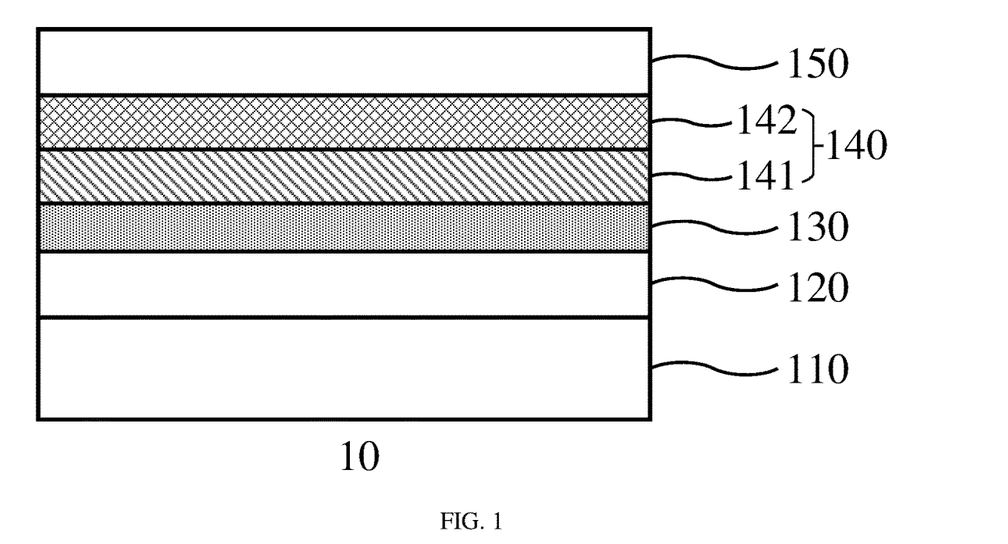
FIG. 1 is a schematic structural diagram of an electroluminescent diode having a hole injection control structure.

Referring to positions of layers shown in FIG. 1, an electroluminescent diode 10 includes a substrate 110, a cathode 120 arranged on the substrate 110, a luminescent layer 130 arranged on the cathode 120, a hole transport layer 140 arranged on the luminescent layer 130, and an anode 150 arranged on the hole transport layer 140.

The hole transport layer 140 has a hole injection control structure. The hole injection control structure includes a first hole conduction layer 141 and a second hole conduction layer 142 that are stacked. A material of the second hole conduction layer 142 is a material of the first hole conduction layer 141 that is P-type doped.

In the conventional electroluminescent diode, holes are injected from an anode into a quantum dot luminescence layer, and the hole injection efficiency is generally low, resulting in an imbalance in numbers of electrons and holes finally transported to the quantum dot luminescent layer. In order to alleviate the problem, the hole transport layer 140 of the electroluminescent diode 10 adopts a hole injection control structure. The hole injection control structure includes the first hole conduction layer 141 formed by the material of the conventional hole transport layer and the second hole conduction layer 142 formed by the material of the first hole conduction layer 141 that is P-type doped. The second hole conduction layer 142 may not only effectively improve hole injection capability of the whole hole transport layer 140 to the luminescent layer 130. P-type doping can also improve film formation and stability of the second hole conduction layer 142, and further improve hole injection capability of the hole transport layer. Therefore, the hole transport layer 140 having the hole injection control structure has higher hole injection capability, so as to balance a number of carriers injected in the luminescent layer 140 as much as possible.

In the electroluminescent diode 10, the first hole conduction layer 141 is arranged on one side close to the luminescent layer 130, and the second hole conduction layer 142 is arranged on one side close to the anode 150. The arrangement of the specific structure enables hole carriers to be more easily injected into the luminescent layer 130 from the anode 150 sequentially through the second hole conduction layer 142 and the first hole conduction layer 141, which is more conducive to improving the hole injection capability of the device.

As a specific example of the embodiment, the material of the first hole conduction layer 141 is selected from at least one of 4,4'-bis(9-carbazolyl)-2,2'-dimethylbiphenyl (CDBP), polyvinylcarbazole (PVK), 4,4',4"-tris(carbazol-9-yl)-triphenylamine (TCTA), 4,4'-bis(9-carbazole) biphenyl (CBP), N,N'-diphenyl-N,N'-(1-naphthyl)-1,1'-biphenyl-4,4'-diamine (NPB), N,N'-diphenyl-N,N'-bis-(1-naphthyl)-1,1'-biphenyl-4,4'-diamine (NPD), and HGG002.

In order to achieve higher cavity injection capability, the material of the first hole conduction layer 141 may be selected from at least one of CBP, NPD, TCTA and HGG002. Further, the material of the first hole conduction layer 141 is CBP and/or HGG002.

As a specific example of the embodiment, in the second hole conduction layer 142, the material for P-type doping is selected from at least one of HAT-CN, $MoO_3$, $WO_3$ and NDP-9.

In order to achieve higher cavity injection capability, in the second hole conduction layer 142, the material for P-type doping is $MoO_3$ and/or NDP-9.

Further, as a specific example of the embodiment, the hole transport layer 140 may be composed of stacked CBP and $MoO_3$-doped CBP, stacked NPD and $MoO_3$-doped NPD, stacked TCTA and $MoO_3$-doped TCTA, stacked HGG002 and $MoO_3$-doped HGG002, or stacked HGG002 and NDP-9-doped HGG002. In one embodiment, the hole transport layer 140 is composed of stacked HGG002 and NDP-9-doped HGG002. It is to be understood that the above only gives some exemplary examples of the present disclosure, which does not mean that the present disclosure can only be implemented in the form described above.

At the same time, thicknesses, mass ratios, and materials of the first hole conduction layer 141 and the second hole conduction layer 142 may also be adjusted appropriately according to actual requirements for the hole injection capability. As a specific example, the thickness of the first hole conduction layer 141 ranges from 10 nm to 200 nm. Further, the thickness ranges from 10 nm to 100 nm. For example, the thickness may be 10 nm, 20 nm, 30 nm, 40 nm, 50 nm, 60 nm, 70 nm, 80 nm, 90 nm or 100 nm. As a specific example, the thickness of the second hole conduction layer 142 ranges from 10 nm to 200 nm. Further, the thickness ranges from 10 nm to 100 nm. For example, the thickness may be 10 nm, 20 nm, 30 nm, 40 nm, 50 nm, 60 nm, 70 nm, 80 nm, 90 nm or 100 nm. In the second hole conduction layer 142, the mass ratio of the material for P-type doping ranges from 3% to 40%, for example, 3%, 5%, 10%, 15%, 20%, 25%, 30%, 35% or 40%.

As a specific example of the embodiment, the substrate 10 is a substrate having high thermal conductivity. For example, a material of the substrate 110 is hard glass, sapphire or plastic filled with a thermal conductive filler. The thermal conductive filler may be specifically selected from at least one of aluminum nitride, aluminum oxide, magnesium oxide or boron carbide. The electroluminescent diode may generate a large amount of joule heat during the operation, which may significantly affect the structure of each layer if the joule heat is not dissipated in time, thereby affecting the overall service life of the device.

As a specific example of the embodiment, the material of the luminescent layer may be a quantum dot or a quantum dot having a core-shell structure. The quantum dot is selected from a quantum dot of an II-VI group compound semiconductor, a quantum dot of an III-V group compound semiconductor, a quantum dot of an I-III-VI group compound semiconductor or a perovskite quantum dot. For the quantum dot having a core-shell structure, a material of the quantum dot in the core layer may be selected from at least one of CdSe, CdS, ZnSe, ZnS, CdTe, CdZnS, CdZnSe, ZnSeS, ZnSeTe, ZnTeS, CdSeS, CdSeTe, CdTeS, CdZnSeS, CdZnSeTe, CdZnSTe, CdSeSTe, ZnSeSTe, CdZnSeSTe, InP, InAs and InAsP, and a material of the quantum dot in the shell layer may be selected from at least one of CdS, ZnSe, ZnS, CdSeS and ZnSeS. A quantum dot light-emitting diode has advantages of exit-light color saturation and adjustable wavelength, and thus is considered as a new-generation display device with great potential for industrialization.

As a specific example of the embodiment, the anode 150 is a transparent film anode to allow light emitted from the luminescent layer 140 to pass through. For example, a material thereof may be selected from silver, a magnesium-silver alloy, gold, indium zinc oxide or indium tin oxide.

During actual use, the electroluminescent diode is also generally required to be packaged or sealed. Therefore, as a specific example of the embodiment, a packaging layer is further included. Generally, a material of the packaging layer may be selected from materials with high refractive indexes such as NPB and $MoO_3$.

In order to solve the problem of the carrier imbalance of the electroluminescent diode, in the conventional art, a number of electrons in the luminescent layer of the quantum dot luminescent layer is reduced by suppressing its electron injection capability, so that the two carriers can be balanced. The electron injection capability may be suppressed by modifying the electron transport layer. For example, a zinc oxide film is modified with some organic polymer compounds as the electron transport layer, so as to suppress the electron injection capability. During actual research, the inventor finds that the suppression of the electron transport capability can solve the problem of carrier imbalance to some extent, but it may be a factor to limit the prolonging of the service life of the electroluminescent diode.

For conventional red and green quantum dot light-emitting diodes, the electron injection capability is generally much greater than the hole injection capability. However, in some special cases, such as a blue quantum dot light-emitting diode, or other cases, the actual problem may be that the hole injection capability of the quantum dot light-emitting diode is greater than the electron injection capability. In this case, it is highly desirable to improve the electron injection capability.

Figure 2:
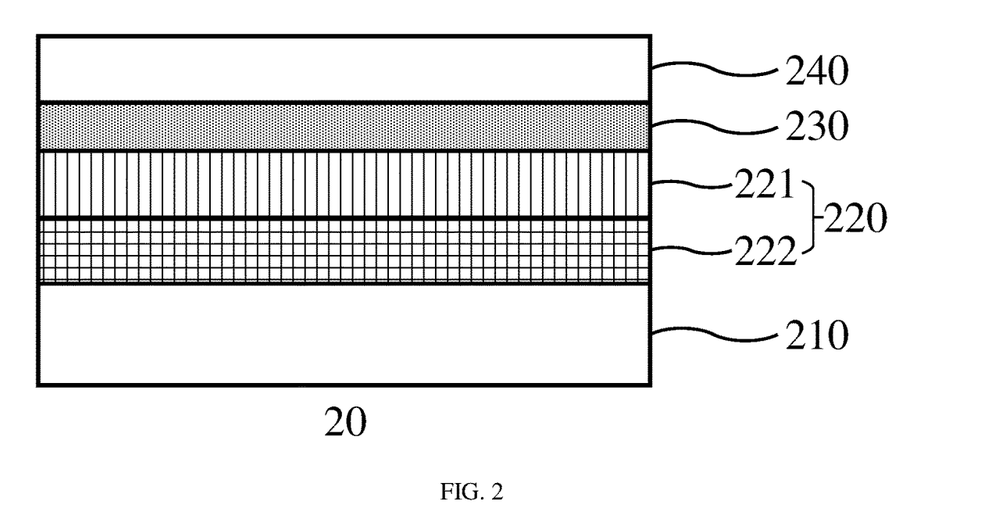
FIG. 2 is a schematic structural diagram of an electroluminescent diode having an electron injection control structure.

Therefore, in another aspect, another embodiment of the present disclosure further provides an electroluminescent diode 20 having an electron injection control structure. Referring to FIG. 2 together, the electroluminescent diode 20 includes a substrate 210, a cathode 220 arranged on the substrate 210, a luminescent layer 230 arranged on the cathode 220, and an anode 240 arranged on the luminescent layer 230.

The cathode 230 includes a third electron conduction layer 221 and a fourth electron conduction layer 222. A material of the third electron conduction layer 221 is a single metal. "Single metal" refers to a metal such as aluminum, silver, magnesium, ytterbium or barium. A material of the fourth electron conduction layer 222 is an alloy of the metal used in the third electron conduction layer 221. For example, if the material of the third electron conduction layer 221 is silver, the material of the fourth electron conduction layer 222 may be a magnesium-silver alloy, an aluminum-silver alloy or other silver alloys. More specifically, the alloy herein may include binary alloys or multi-element alloys of silver. During the formation, it may be a composite metal film formed by joint deposition of silver and other metals.

In one implementation, in the electron injection control structure, the third electron conduction layer 221 is arranged on one side close to the luminescent layer 230, and the fourth electron conduction layer 222 is arranged on one side close to the substrate 210.

Similarly, thicknesses, mass ratios, and materials of the third electron conduction layer 221 and the fourth electron conduction layer 222 may also be adjusted appropriately according to actual requirements for the electron injection capability. As a specific example, the thickness of the third electron conduction layer 221 ranges from 10 nm to 200 nm. Further, the thickness ranges from 25 nm to 150 nm. For example, the thickness may be 25 nm, 30 nm, 40 nm, 50 nm, 60 nm, 70 nm, 80 nm, 90 nm, 100 nm, 110 nm, 120 nm, 130 nm, 140 nm or 150 nm. As a specific example, the thickness of the fourth electron conduction layer 222 ranges from 10 nm to 200 nm. Further, the thickness ranges from 25 nm to 150 nm. For example, the thickness may be 25 nm, 30 nm, 40 nm, 50 nm, 60 nm, 70 nm, 80 nm, 90 nm, 100 nm, 110 nm, 120 nm, 130 nm, 140 nm or 150 nm. In the fourth electron conduction layer 222, the amount of metal for doping accounts for 10% to 30% of the total amount. That is, a mass ratio of the metal for doping to a metal elemental substance ranges from (1:9) to (3:7).

Materials of other layers of the electroluminescent diode 20 may also be obtained with reference to the materials of the corresponding layers of the electroluminescent diode 10 described above.

By modifying the cathode and appropriately adjusting an electron conduction path, the electroluminescent diode with an electron injection control structure can promote electron injection to some extent to prevent the occurrence of the above situation, thereby prolonging an effective service life of the device. Further, higher electron injection and hole injection may also effectively improve the luminous efficiency of the device, which has high application value.

Figure 3:
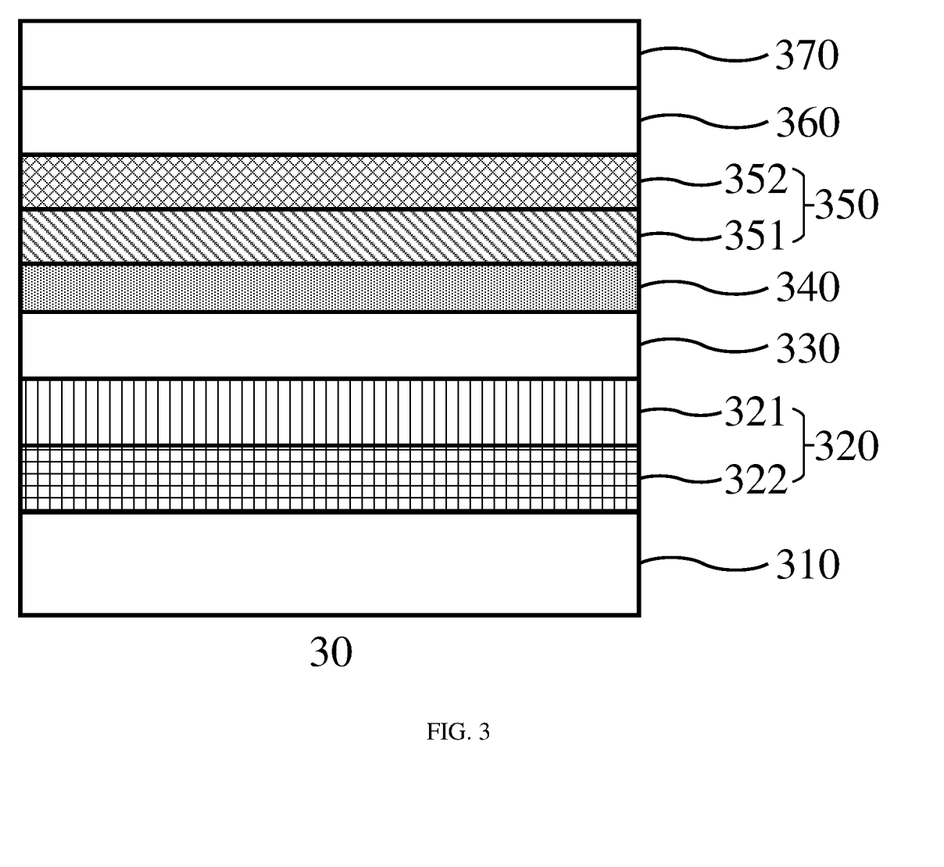
FIG. 3 is a schematic structural diagram of an electroluminescent diode having a hole injection control structure and an electron injection control structure.

In yet another aspect, another embodiment of the present disclosure further provides an electroluminescent diode 30 with a carrier injection control structure. Referring to FIG. 3 together, the carrier injection control structure includes both the hole injection control structure and the electron injection control structure, which has advantages of the above two and enables them to match and cooperate with each other.

The electroluminescent diode 30 includes a substrate 310, a cathode 320 arranged on the substrate 310, a luminescent layer 340 arranged on the cathode 320, a hole transport layer 350 arranged on the luminescent layer 340, and an anode 370 arranged on the hole transport layer 350. During actual use, in order to further optimize the performance of the electroluminescent diode 30, as a specific example, the electroluminescent diode 30 further includes an electron transport layer 330 arranged between the cathode 320 and the luminescent layer 340 and a hole injection layer 360 arranged between the hole transport layer 350 and the anode 370. It is to be understood that, in other specific examples, the electron transport layer 330 and the hole injection layer 360 may not be provided.

As a specific example of the embodiment, a material of the electron transport layer 330 may be selected from an inorganic material or an organic material with electron conduction capability. More specifically, the inorganic material is selected from at least one of zinc oxide, titanium dioxide, stannic oxide, magnesium-doped zinc oxide and aluminum-doped zinc oxide. The organic material is selected from at least one of TPBi, BCP, Bphen, TmPyTz and B3PYMPM.

As a specific example of the embodiment, a material of the hole injection layer 360 is selected from a material with hole conduction capability, for example, at least one of HAT-CN, $MoO_3$, $WO_3$, $V_2O_5$ and $Ta_2O_5$.

The hole transport layer 350 of the electroluminescent diode 30 has a hole injection control structure the same as the hole injection control structure shown in the electroluminescent diode 10. That is, the hole transport layer 350 includes a first hole conduction layer 351 and a second hole conduction layer 352. The cathode 320 of the electroluminescent diode 30 has an electron injection control structure the same as the electron injection structure shown in the electroluminescent diode 20. That is, the cathode 320 includes a first electron conduction layer 321 and a second electron conduction layer 322. Materials of the layers may be obtained with reference to the materials used in the electroluminescent diode 10 and the electroluminescent diode 20.

As a specific example, the first hole conduction layer 351 is arranged on one side close to the luminescent layer 340, and the second hole conduction layer 352 is arranged on one side close to the anode 370. In the electron injection control structure, the first electron conduction layer 321 is arranged on one side close to the luminescent layer 340, and the second electron conduction layer 322 is arranged on one side close to the substrate 310.

The hole injection control structure can significantly improve the hole injection capability of the device, and even enable the hole injection capability of the device to exceed the electron injection capability. Therefore, the electron injection control structure is also introduced to increase the electron injection capability of the device. Thus, the carrier injection control structure can not only balance the number of carriers, but also significantly increase the number of each carrier, and effectively improve the luminous performance of the electroluminescent diode 30. On the other hand, the service life of the electroluminescent diode 30 is also significantly prolonged by adopting a strategy that appropriately enhances the electron injection capability rather than a common strategy of "suppressing the electron injection capability".

In addition, it is to be understood that the electron transport layer 330 and the hole injection layer 360 included in the structure of the electroluminescent diode 30 in this embodiment may also be simultaneously combined with the electroluminescent diode 10 and the electroluminescent diode 20. Other further embodiments based on the two embodiments are not described in detail.

The electroluminescent diodes according to the above embodiments are actually electroluminescent diodes having an inverted top-emitting structure. An inverted structure corresponds to a normal structure. Specifically, the "inverted structure" refers to that the cathode is arranged on the substrate, the anode is arranged on a surface layer of the device away from the substrate, and the layers between the cathode and the anode are correspondingly arranged in order. If the light is emitted from the anode at the top, it is an inverted top-emitting structure. If the light is emitted from the cathode at the bottom, it is an inverted bottom-emitting structure. The "normal structure" refers to that the anode is arranged on the substrate, the cathode is arranged on a surface layer of the device away from the substrate, and the layers between the cathode and the anode are correspondingly arranged in order.

The structure of the conventional electroluminescent diode is generally a normal bottom-emitting structure. However, due to the problem of an aperture ratio of the device, the light emission efficiency is not good in the bottom-emitting structure. Energy levels of an opaque anode and a hole injection layer in a normal top-emitting structure do not match, and the hole injection layer has poor film formation on an anode surface, so it is not practical. The electroluminescent diodes according to the above embodiments all adopt an inverted top-emitting structure.

According to one embodiment of the present disclosure, a manufacturing method of an electroluminescent diode having an inverted structure is further provided, including the following steps.

A substrate is provided, and a cathode is formed on the substrate.

A luminescent layer is formed on the cathode, and the luminescent layer is a quantum dot luminescent layer.

A first hole conduction layer and a second hole conduction layer are formed on the luminescent layer. As a specific example of this embodiment, the first hole conduction layer is formed on one side close to the luminescent layer, and the second hole conduction layer is formed on the first hole conduction layer. In other specific examples, the order in which the two layers are formed may also be adjusted.

An anode is formed on the second hole conduction layer.

Optionally, during the formation of the cathode, the following step is further included: forming a first electron conduction layer and a second electron conduction layer on the substrate. As a specific example, the second electron conduction layer is formed on one side close to the substrate, and the first electron conduction layer is formed on the second electron conduction layer.

Considering the practical application of the device, as an optional specific example, the manufacturing method further includes a step of forming an electron transport layer between the cathode and the quantum dot luminescent layer, and a step of forming a hole injection layer between the hole transport layer and the anode.

According to another embodiment of the present disclosure, another manufacturing method of an electroluminescent diode having an inverted structure is further provided, including the following steps.

A substrate is provided, and a cathode is formed. A third electron conduction layer and a fourth electron conduction layer are formed on the substrate. As a specific example of this embodiment, the fourth electron conduction layer is formed on one side close to the substrate, and the third electron conduction layer is formed on the fourth electron conduction layer. In other specific examples, the order in which the two layers are formed may also be adjusted.

A luminescent layer is formed on the third electron conduction layer, and the luminescent layer is a quantum dot luminescent layer.

An anode is formed on the quantum dot luminescent layer.

Considering the practical application of the device, as an optional specific example, the manufacturing method further includes a step of forming an electron transport layer between the cathode and the quantum dot luminescent layer, a step of forming a hole transport layer between the anode and the quantum dot luminescent layer, and a step of forming a hole injection layer between the hole transport layer and the anode.

In the manufacturing methods according to the above embodiments, the materials used in the layers are the materials used in the corresponding layers of the electroluminescent diodes according to the above embodiments.

The cathode may be formed by evaporation, sputtering or chemical etching. The process of forming the cathode includes first depositing an alloy of the metallic element on the substrate as the fourth electron conduction layer of the cathode, and then depositing a metallic element layer as the third electron conduction layer of the cathode. As a specific example, the process of forming the cathode involves first co-evaporating a magnesium-silver alloy layer, and then evaporating a single silver metal layer.

The electron transport layer may be formed by spin coating, ink-jet printing, sputtering, or vapor liquid deposition (VLD). As a specific example, the electron transport layer is formed by spin-coating a magnesium-doped zinc oxide film.

The luminescent layer is formed by spin coating or ink-jet printing. As a specific example, the luminescent layer is formed by spin-coating a layer of CdSe/ZnS core-shell quantum dots on a surface of the electron transport layer and performing annealing.

The process of forming the hole transport layer includes: depositing a material of a first hole conduction layer and a material of a second hole conduction layer on a surface of the quantum dot luminescent layer formed, and forming the first hole conduction layer and the second hole conduction layer. The material of the second hole conduction layer is the material of the first hole conduction layer that is P-type doped. In one embodiment, the material of the first hole conduction layer may be deposited first, and then the material of the second hole conduction layer may be deposited. As a specific example, the hole transport layer is formed by evaporation. For example, a layer of CBP and then a layer of $MoO_3$-doped CBP are evaporated on the surface of the quantum dot luminescent layer.

The hole injection layer is formed by evaporation. As a specific example, the process of forming the hole injection layer involves evaporating a layer of $MoO_3$ on a surface of the hole transport layer.

The anode is formed by evaporation. As a specific example, the process of forming the anode involves evaporating a layer of silver on a surface of the hole injection layer. For the top-emitting structure, the anode may be a transparent anode.

The manufacturing method for an electroluminescent diode in other embodiments further includes a step of forming a packaging layer. The packaging layer is also formed by evaporation. A material of the packaging layer is selected from NPB or $MoO_3$. As a specific example, the process of forming the packaging layer involves forming a layer of NPB on a surface of the anode.

In the electroluminescent diodes according to the above embodiments or the electroluminescent diodes manufactured with the manufacturing methods of an electroluminescent diode, the hole transport layer is a hole injection control structure, which may significantly enhance hole injection capability of the hole transport layer to balance the number of carriers in the quantum dot luminescent layer of the device. Moreover, the hole injection capability may also be adjusted by adjusting thicknesses, materials and proportions of the layers in the hole injection control structure to make carrier balance of the device more controllable. Further, the cathode has a similar electron injection control structure to optimize electron injection, which may further improve the luminous efficiency and prolong the service life of the device. Furthermore, for the carrier injection control structure, the device is arranged as an inverted top-emitting structure, so as to further improve the efficiency and prolong the service life of the electroluminescent diode.

In another aspect, according to one embodiment of the present disclosure, a display device including the electroluminescent diode or manufactured with the manufacturing method of an electroluminescent diode is further provided, which has significantly superior luminous performance and service life.

In order to make it easier to understand and implement the present disclosure, the present disclosure also provides the following easier-to-implement, more specific and detailed test examples as a reference. The embodiments and advantages of the present disclosure will be more obvious through the description and performance results of specific test examples described below. The following test examples and comparative examples involve a red quantum dot light-emitting diode.

Raw materials used in the following test examples and comparative examples may be routinely purchased from the market unless otherwise specified. A specific model of HGG002 is Merck HTM081.

Test Example 1

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) Silver with a thickness of 100 nm was successively evaporated on the glass substrate as an opaque cathode.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) On a surface of a quantum dot transport layer, CBP with a thickness of 20 nm was first evaporated, and then $MoO_3$-doped CBP with a thickness of 20 nm was evaporated, to form a hole transport layer. In the latter evaporation process, a mass ratio of $MoO_3$ to CBP was 2:8.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Test Example 2

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) On a surface of a quantum dot transport layer, CBP with a thickness of 20 nm was first evaporated, and then $MoO_3$-doped CBP with a thickness of 20 nm was evaporated, to form a hole transport layer. In the latter evaporation process, a mass ratio of $MoO_3$ to CBP was 2:8.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Test Example 3

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 40 nm and silver with a thickness of 40 nm were successively evaporated on the glass substrate as an opaque cathode. A mass ratio of magnesium to silver in the magnesium-silver alloy was 3:7.

(3) A MgZnO film with a thickness of 40 nm was formed on the opaque cathode by spin coating, and was annealed at 120° C. for 30 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 12 mg/mL. The layer of quantum dots had a thickness of 20 nm and was annealed at 100° C. for 5 min.

(5) On a surface of a quantum dot transport layer, NPD with a thickness of 30 nm was first evaporated, and then MoO$_3$-doped NPD with a thickness of 20 nm was evaporated, to form a hole transport layer. In the latter evaporation process, a mass ratio of MoO$_3$ to NPD was 2:8.

(6) MoO$_3$ with a thickness of 8 nm was evaporated on a surface of the hole transport layer to form a hole injection layer.

(7) Aluminum-doped zinc oxide with a thickness of 40 nm was evaporated on a surface of the hole injection layer to form a transparent anode.

(8) An NPB material with a thickness of 60 nm was evaporated on a surface of the transparent anode to form a packaging layer.

Test Example 4

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) An ytterbium-silver alloy with a thickness of 50 nm and silver with a thickness of 50 nm were successively evaporated on the glass substrate as an opaque cathode. A mass ratio of ytterbium to silver in the ytterbium-silver alloy was 1:9.

(3) A ZnO film with a thickness of 50 nm was formed on the opaque cathode by sputtering.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 20 nm and was annealed at 100° C. for 5 min.

(5) On a surface of a quantum dot transport layer, NPD with a thickness of 20 nm was first evaporated, and then MoO$_3$-doped NPD with a thickness of 20 nm was evaporated, to form a hole transport layer. In the latter evaporation process, a mass ratio of MoO$_3$ to NPD was 2:8.

(6) MoO$_3$ with a thickness of 8 nm was evaporated on a surface of the hole transport layer to form a hole injection layer.

(7) Aluminum-doped zinc oxide with a thickness of 40 nm was evaporated on a surface of the hole injection layer to form a transparent anode.

(8) An NPB material with a thickness of 60 nm was evaporated on a surface of the transparent anode to form a packaging layer.

Test Example 5

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A ZnO film with a thickness of 50 nm was formed on the opaque cathode by sputtering.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 20 nm and was annealed at 100° C. for 5 min.

(5) On a surface of a quantum dot transport layer, TCTA with a thickness of 20 nm was first evaporated, and then HAT-CN-doped TCTA with a thickness of 20 nm was evaporated, to form a hole transport layer. In the latter evaporation process, a mass ratio of HAT-CN to TCTA was 2:8.

(6) MoO$_3$ with a thickness of 8 nm was evaporated on a surface of the hole transport layer to form a hole injection layer.

(7) Aluminum-doped zinc oxide with a thickness of 40 nm was evaporated on a surface of the hole injection layer to form a transparent anode.

(8) An NPB material with a thickness of 60 nm was evaporated on a surface of the transparent anode to form a packaging layer.

Test Example 6

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A ZnO film with a thickness of 50 nm was formed on the opaque cathode by sputtering.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 20 nm and was annealed at 100° C. for 5 min.

(5) On a surface of a quantum dot transport layer, HGG002 with a thickness of 20 nm was first evaporated, and then NDP-9-doped HGG002 with a thickness of 20 nm was evaporated, to form a hole transport layer. In the latter evaporation process, a mass ratio of NDP-9 to HGG002 was 2:8.

(6) MoO$_3$ with a thickness of 8 nm was evaporated on a surface of the hole transport layer to form a hole injection layer.

(7) Aluminum-doped zinc oxide with a thickness of 40 nm was evaporated on a surface of the hole injection layer to form a transparent anode.

(8) An NPB material with a thickness of 60 nm was evaporated on a surface of the transparent anode to form a packaging layer.

Comparative Example 1

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) Silver with a thickness of 100 nm was evaporated on the glass substrate as an opaque cathode.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) CBP with a thickness of 40 nm was evaporated on a surface of a quantum dot transport layer to form a hole transport layer.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Comparative Example 2

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) CBP with a thickness of 40 nm was evaporated on a surface of a quantum dot transport layer to form a hole transport layer.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Comparative Example 3

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) $MoO_3$-doped CBP with a thickness of 40 nm was evaporated on a surface of a quantum dot transport layer, to form a hole transport layer. A mass ratio of $MoO_3$ to CBP was 2:8.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Comparative Example 4

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) A magnesium-silver alloy with a thickness of 50 nm and silver with a thickness of 50 nm were successively evaporated on the glass substrate as an opaque cathode. A mass ratio of magnesium to silver in the magnesium-silver alloy was 3:7.

(3) A MgZnO film with a thickness of 50 nm was formed on the opaque cathode by spin coating, and was annealed at 120° C. for 10 min to form an electron transport layer. A doping ratio of magnesium was 5%.

(4) A layer of quantum dots was spin-coated on the electron transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(5) On a surface of a quantum dot transport layer, $MoO_3$-doped CBP with a thickness of 20 nm was first evaporated, and then CBP with a thickness of 20 nm was evaporated, to form a hole transport layer. A mass ratio of $MoO_3$ to CBP was 2:8.

(6) $MoO_3$ with a thickness of 8 nm was evaporated on a surface of the hole transport layer to form a hole injection layer.

(7) Silver with a thickness of 20 nm was evaporated on a surface of the hole injection layer to form a transparent anode.

(8) An NPB material with a thickness of 70 nm was evaporated on a surface of the transparent anode to form a packaging layer.

Comparative Example 5

(1) A glass substrate was sequentially placed in detergent, deionized water, acetone, ethanol and deionized water for ultrasonic cleaning. The glass substrate undergoes ultrasonic cleaning 15 min each time, and then was dried at 100° C.

(2) Silver with a thickness of 50 nm was evaporated on a surface of the glass substrate to form an anode.

(3) $MoO_3$ with a thickness of 8 nm was evaporated on a surface of the anode to form a hole injection layer.

(4) On a surface of the hole injection layer, $MoO_3$-doped CBP with a thickness of 20 nm was first evaporated, and then CBP with a thickness of 20 nm was evaporated, to form a hole transport layer. A mass ratio of $MoO_3$ to CBP was 2:8.

(5) A layer of quantum dots was spin-coated on the hole transport layer and annealed to form a quantum dot luminescent layer. The quantum dots were CdSe/ZnS core-shell structure red quantum dots which were dispersed in an n-octane solvent with a concentration of 15 mg/mL. The layer of quantum dots had a thickness of 15 nm and was annealed at 100° C. for 5 min.

(6) A MgZnO film with a thickness of 50 nm was formed on a surface of the quantum dot luminescent layer by spin coating, and was annealed at 120° C. for 10 min to form an electron transport layer. A doping ratio of magnesium was 5%.

Figure 4:
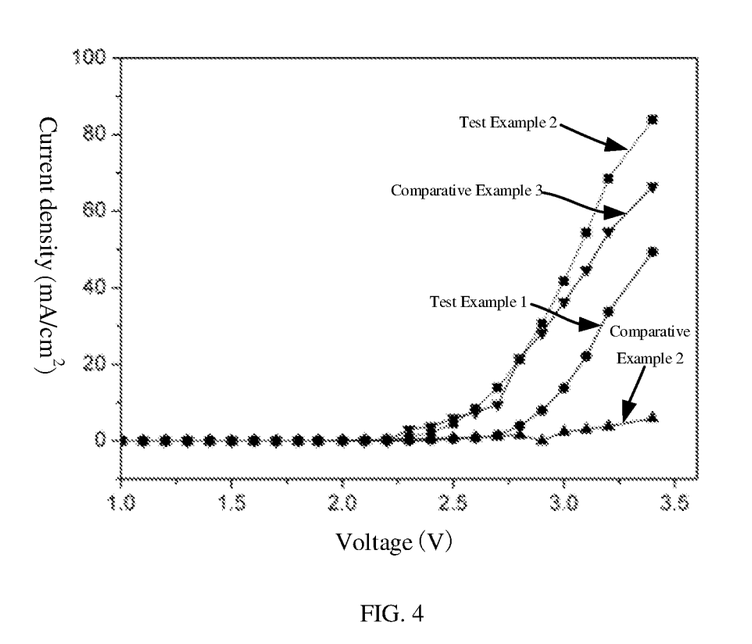
FIG. 4 is a diagram of test results of current-voltage performance of an electroluminescent diode obtained from Test Examples 1 to 2 and Comparative Examples 2 to 3.
Figure 5:
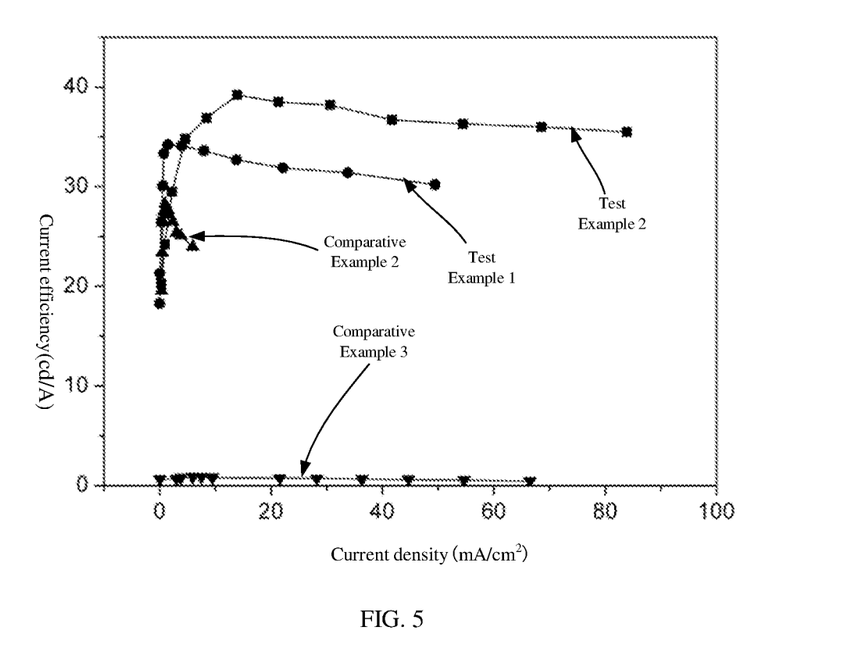
FIG. 5 is a diagram of test results of current efficiency of an electroluminescent diode obtained from Test Examples 1 to 2 and Comparative Examples 2 to 3.

(7) Silver with a thickness of 10 nm and a magnesium-silver alloy with a thickness of 10 nm were successively evaporated on a surface of the electron transport layer as a transparent cathode. A mass ratio of magnesium to silver in the magnesium-silver alloy was 3:7.

layer in Comparative Example 3 is directly in contact with the quantum dot luminescent layer, the current only drops slightly, but combined with the current efficiency curve in FIG. 5, it may be found that the current efficiency is extremely low, which is caused by interface quenching. At the same time, the efficiency in Test Example 1 and Test Example 2 is significantly higher, indicating that Test Example 1 and Test Example 2 including the hole injection control structure have the most balanced carrier injection. At the same time, referring to FIG. 4, the maximum efficiency of Test Example 2 with both the electron injection control structure and the hole injection control structure may reach 39.2 cd/A, and the maximum efficiency of Test Example 1 with only the hole injection control structure may reach 34.5 cd/A, indicating that the hole injection control structure may significantly increase its current efficiency.

Figure 6:
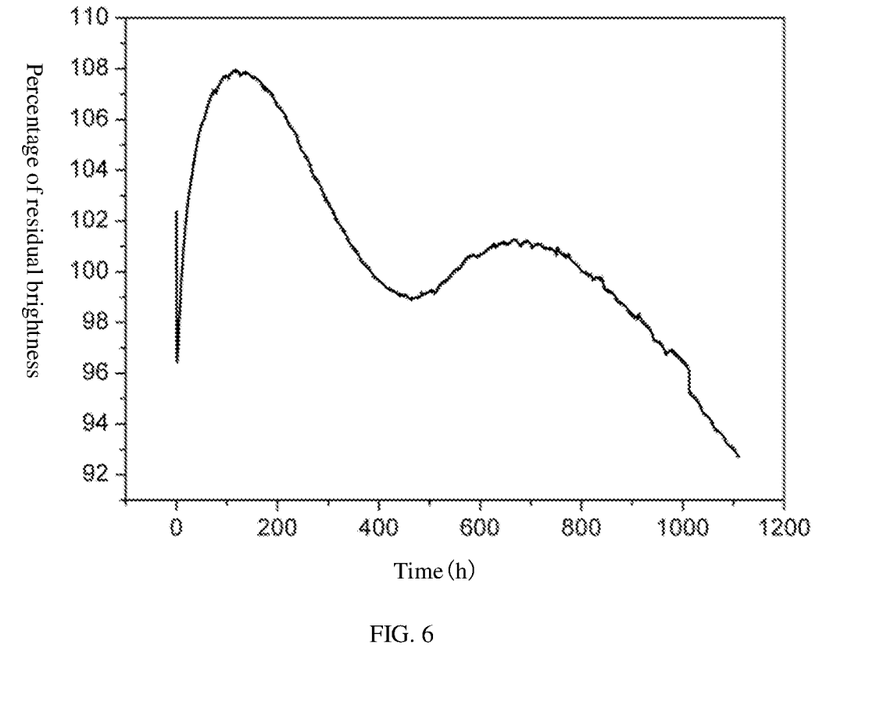
FIG. 6 is a diagram of test results of a service life of an electroluminescent diode obtained from Test Example 2.

In addition, FIG. 6 shows a curve of test brightness of a quantum dot light-emitting diode in Test Example 2 versus time. A test condition is high brightness (10000 nit).

In addition, Table 1 further shows the performance test results of the above test examples, the comparative examples and other test examples, to further illustrate the advantages of the electroluminescent diode with a hole injection structure and an electron injection structure. Please refer to Table 1 for details.

TABLE 1

|  | Test Example 1 | Test Example 2 | Test Example 3 | Test Example 4 | Test Example 5 | Test Example 6 |
| --- | --- | --- | --- | --- | --- | --- |
| Maximum current efficiency (cd/A) | 34.5 | 39.2 | 33.4 | 35.2 | 29.6 | 37.8 |
| Service life (T95@1000 nit/h) | 11327 | 16453 | 8795 | 10101 | 8253 | 15812 |

|  | Comparative Example 1 | Comparative Example 2 | Comparative Example 3 | Comparative Example 4 | Comparative Example 5 |
| --- | --- | --- | --- | --- | --- |
| Maximum current efficiency (cd/A) | 28.5 | 16.2 | 0.8 | 0.6 | 18.5 |
| Service life (T95@1000 nit/h) | 865 | 426 | 143 | 85 | 2321 |

(8) An NPB material with a thickness of 70 nm was evaporated on a surface of the transparent cathode to form a packaging layer.

Referring to FIG. 4 for current-voltage test curves in Test Examples 1 to 2 and Comparative Examples 2 to 3, according to conditions in the test examples and the comparative examples, Test Example 1 has a single hole injection control structure, while Test Example 2 has both a hole injection control structure and an electron injection control structure; Comparative Example 2 and Comparative Example 3 have an electron injection control structure but do not have any hole injection control structure. The comparison between Test Example 1 and Test Example 2 shows that the electron injection control structure may improve electron injection. The comparison between Test Example 1 and Comparative Examples 2 to 3 shows that $MoO_3$ doping may greatly improve the performance of hole injection.

The comparison between Comparative Example 2 and Comparative Example 3 shows that if the $MoO_3$ doping Experimental results show that the electroluminescent diode with a hole injection structure and an electron injection structure has significantly higher current efficiency and service life, indicating that the structure has a significant effect on the balance of carriers. In addition, electron injection may be fully adjusted by adjusting doping ratios, thicknesses and types of impurity elements in a cathode alloy, so that the electron injection can meet requirements of use. The performance of hole injection may also be adjusted through doping ratios, thicknesses and materials of P-type doping materials in the hole transport layer. The carrier balance may be effectively controlled for the electroluminescent diode made of specific materials with the control method described above, so as to significantly improve the current efficiency and prolong the service life of the electroluminescent diode. Therefore, the above structure is also extremely practical.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe a preferred implementation of the present disclosure, and the description thereof is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. An electroluminescent diode, comprising:
a substrate; and
a functional body arranged on the substrate;
the functional body comprising:
a cathode and an anode arranged opposite to each other;
a luminescent layer, the luminescent layer being arranged between the cathode and the anode; and
a hole transport layer, the hole transport layer being arranged between the luminescent layer and the anode, the hole transport layer having a hole injection control structure, the hole injection control structure comprising a first hole conduction layer and a second hole conduction layer that are stacked, a material of the second hole conduction layer being a material of the first hole conduction layer that is P-type doped;
wherein the cathode has an electron injection control structure, the electron injection control structure comprises a first electron conduction layer and a second electron conduction layer that are stacked, a material of the first electron conduction layer is a single metal, and a material of the second electron conduction layer is an alloy containing the metal used in the first electron conduction layer.

2. The electroluminescent diode according to claim 1, wherein in the hole injection control structure, the first hole conduction layer is arranged on one side close to the luminescent layer, and the second hole conduction layer is arranged on one side close to the anode.

3. The electroluminescent diode according to claim 1, wherein an amount of the material for P-type doping in the second hole conduction layer accounts for 3% to 40% of a total amount thereof.

4. The electroluminescent diode according to claim 1, wherein the electroluminescent diode is of an inverted top-emitting structure.

5. The electroluminescent diode according to claim 1, wherein the material of the first hole conduction layer is selected from at least one of CDBP, PVK, TCTA, CBP, NPB, NPD, or HGG002.

6. The electroluminescent diode according to claim 1, wherein the material for P-type doping in the second hole conduction layer is selected from at least one of HAT-CN, $MoO_3$, $WO_3$, or NDP-9.

7. The electroluminescent diode according to claim 1, wherein the material of the first hole conduction layer is selected from CBP, and the material of the second hole conduction layer is $MoO_3$-doped CBP.

8. The electroluminescent diode according to claim 1, wherein the material of the first hole conduction layer is selected from HGG002, and the material of the second hole conduction layer is NDP-9-doped HGG002.

9. The electroluminescent diode according to claim 1, wherein the first electron conduction layer is arranged on one side close to the luminescent layer, and the second electron conduction layer is arranged on one side of the first electron conduction layer away from the luminescent layer.

10. The electroluminescent diode according to claim 1, wherein the material of the first electron conduction layer is selected from aluminum, silver, magnesium, ytterbium or barium.

11. The electroluminescent diode according to claim 10, wherein the material of the first electron conduction layer is silver, and the material of the second electron conduction layer is a magnesium-silver alloy or an ytterbium-silver alloy.

12. The electroluminescent diode according to claim 1, wherein in the alloy material of the second electron conduction layer, an amount of the metal used in the first electron conduction layer accounts for 70% to 90% of a total amount thereof.

13. The electroluminescent diode according to claim 1, further comprising an electron transport layer arranged between the cathode and the luminescent layer, and a material of the electron transport layer is selected from at least one of zinc oxide, titanium dioxide, stannic oxide, magnesium-doped zinc oxide, or aluminum-doped zinc oxide; and/or
the electroluminescent diode further comprises a hole injection layer arranged between the anode and the hole transport layer, and a material of the hole injection layer is selected from at least one of HAT-CN, $MoO_3$, $WO_3$, $V_2O_5$, Or $Ta_2O_5$; and/or
a material of the substrate is selected from hard glass, sapphire or flexible plastic filled with a thermal conductive filler; and/or
the luminescent layer is a quantum dot luminescent layer, and a material of the quantum dot luminescent layer is selected from a quantum dot of an II-VI group compound semiconductor, a quantum dot of an III-V group compound semiconductor, a quantum dot of an I-III-VI group compound semiconductor or a perovskite quantum dot.

14. An electroluminescent diode, comprising:
a substrate; and
a functional body arranged on the substrate;
the functional body comprising:
a cathode and an anode arranged opposite to each other;
a luminescent layer, the luminescent layer being arranged between the cathode and the anode;
wherein the cathode has an electron injection control structure, the electron injection control structure comprises a third electron conduction layer and a fourth electron conduction layer that are stacked, a material of the third electron conduction layer is a single metal, and a material of the fourth electron conduction layer is an alloy containing the metal used in the third electron conduction layer.

15. The electroluminescent diode according to claim 14, wherein the third electron conduction layer is arranged on one side close to the luminescent layer, and the fourth electron conduction layer is arranged on one side of the third electron conduction layer away from the luminescent layer.

16. The electroluminescent diode according to claim 14, wherein the material of the third electron conduction layer is selected from aluminum, silver, magnesium, ytterbium or barium.

17. The electroluminescent diode according to claim 14, wherein in the alloy material of the fourth electron conduction layer, an amount of the metal used in the third electron conduction layer accounts for 70% to 90% of a total amount thereof.

18. The electroluminescent diode according to claim 14, wherein the material of the third electron conduction layer is silver, and the material of the fourth electron conduction layer is a magnesium-silver alloy.

19. A display device, comprising a driving element and an electroluminescent diode; the driving element being configured to control luminescence of the electroluminescent diode, and the electroluminescent diode being the electroluminescent diode according to claim 1.

* * * * *